United States Patent
Williams et al.

(10) Patent No.: US 11,936,181 B2
(45) Date of Patent: Mar. 19, 2024

(54) EARTH FAULT SECTIONALIZER FOR ELECTRIC POWER DISTRIBUTION NETWORK

(71) Applicant: S&C Electric Company, Chicago, IL (US)

(72) Inventors: Stephen E. Williams, Caledonia, WI (US); Martin T. Bishop, Oak Creek, WI (US); David Klein, Sturgis, MI (US)

(73) Assignee: S&C Electric Company, Chicago, IL (US)

( * ) Notice: Subject to any disclaimer, the term of this patent is extended or adjusted under 35 U.S.C. 154(b) by 188 days.

(21) Appl. No.: 17/834,976

(22) Filed: Jun. 8, 2022

(65) Prior Publication Data

US 2023/0056065 A1 Feb. 23, 2023

Related U.S. Application Data

(60) Provisional application No. 63/233,848, filed on Aug. 17, 2021.

(51) Int. Cl.
*H02H 9/08* (2006.01)
*G01R 31/52* (2020.01)

(52) U.S. Cl.
CPC .............. *H02H 9/08* (2013.01); *G01R 31/52* (2020.01)

(58) Field of Classification Search
CPC .................................. H02H 9/08; G01R 31/52
USPC ........................................................... 361/43
See application file for complete search history.

(56) References Cited

U.S. PATENT DOCUMENTS

| | | | | |
|---|---|---|---|---|
| 6,466,031 | B1 * | 10/2002 | Hu | G01R 31/085 |
| | | | | 324/522 |
| 9,577,421 | B2 * | 2/2017 | Barker | F03D 7/0284 |
| 2011/0298468 | A1 | 12/2011 | Wahlroos et al. | |
| 2016/0041216 | A1 | 2/2016 | Tang et al. | |

(Continued)

FOREIGN PATENT DOCUMENTS

| | | | | |
|---|---|---|---|---|
| DE | 10163405 A1 * | 7/2002 | | G01R 31/085 |
| EP | 1936773 A1 * | 6/2008 | | G01R 27/16 |

(Continued)

OTHER PUBLICATIONS

International Search Report and Written Opinion for International Application No. PCT/US2022/32587 dated Sep. 21, 2022dated . (11 pages).

*Primary Examiner* — Dharti H Patel

(57) ABSTRACT

A system and method for identifying an earth fault in a resonant grounded medium voltage network that employs a REFCL compensation system. The method derives a zero-sequence real power from a phase voltage to ground on each phase and a current on each phase and aligns the zero-sequence real power in time with a magnitude of a zero-sequence voltage provided by the REFCL compensation system. The method determines when the zero-sequence real power and the zero-sequence voltage exceed predetermined thresholds. The method delays the magnitude of the zero-sequence voltage for a predetermined period of time when the zero-sequence voltage exceeds the threshold and determines that the fault is occurring when both the time aligned zero-sequence real power exceeds the threshold and the magnitude of the zero-sequence voltage exceeds the threshold for the predetermined period of time at the same time.

19 Claims, 1 Drawing Sheet

(56) References Cited

U.S. PATENT DOCUMENTS

| | | |
|---|---|---|
| 2018/0203056 A1 | 7/2018 | Dzienis et al. |
| 2021/0075210 A1* | 3/2021 | Wahlroos ............... H02H 3/165 |
| 2023/0056065 A1* | 2/2023 | Williams ................ H02H 9/08 |

FOREIGN PATENT DOCUMENTS

| | | | |
|---|---|---|---|
| WO | WO-9829752 A1 * | 7/1998 | ........... G01R 31/086 |
| WO | WO-2007090484 A1 * | 8/2007 | ........... G01R 31/025 |
| WO | WO-2011029464 A1 * | 3/2011 | ............. H02H 3/081 |
| WO | WO-2011072732 A1 * | 6/2011 | ............... H02H 3/40 |

* cited by examiner

EARTH FAULT SECTIONALIZER FOR ELECTRIC POWER DISTRIBUTION NETWORK

CROSS-REFERENCE TO RELATED APPLICATION

This application claims the benefit of priority from the U.S. Provisional Application No. 63/233,848, filed on Aug. 17, 2021, the disclosure of which is hereby expressly incorporated herein by reference for all purposes.

BACKGROUND

Field

This disclosure relates generally to a system and method for detecting a fault in a medium voltage electric power distribution network and, more particularly, to a system and method for identifying an earth fault in a resonant grounded medium voltage network that employs a rapid earth fault current limiting (REFCL) compensation system.

Discussion of the Related Art

Medium voltage (MV) electric power distribution networks in North America (NA) are predominantly four-wire multi-grounded neutral networks. However, a certain number of the distribution networks in NA have been designed and built with alternative configurations, such as uni-grounded system designs and delta connected distribution systems at 4 kiloVolts (kV) employed in suburban developments. Impedance grounded systems are commonly employed in industrial MV networks to limit ground fault currents throughout the facility. Three-wire networks are common in many parts of the world. Three-wire system designs connect all of the loads between phases, which limits the unbalanced ground current that normally flows on four-wire networks to that caused by system capacitance and ground fault events. Ground fault detection systems require a different approach depending on the design of the specific distribution network. The absence of the unbalance component from a single line to ground connected load transformers generally allows more sensitive ground fault current sensing systems. Ground fault currents and voltages can be obtained through a variety of short circuit programs that represent the details of the distribution network. Representation of the system using symmetrical component sequence networks provides insight into the performance of the system under fault conditions.

REFCL compensation systems have been implemented to reduce the total arc energy at the point of a medium voltage distribution circuit earth fault in these types of resonant earth ground networks. This is accomplished through the addition of a single phase inverter or compensator to the arc suppression coil, commonly known as a Petersen Coil, in the substation of resonant earth networks. When the circuit phase with the earth fault is determined, the REFCL compensation system injects a current into the network that forces the faulted phase voltage to nearly zero, which effectively eliminates the voltage that drives the arcing current at the earth fault location. More particularly, when a ground fault occurs, sensing circuits will detect the shift in the neutral point that occurs due to the ground fault on the network with the Peterson Coil in the neutral. The REFCL compensation system controller senses the line to ground voltage on each phase of the network and will then inject a zero-sequence current that reduces the faulted phase voltage at the substation to 250 volts or less. The resulting low voltage at the fault point will result in the extinguishing of any arcing at the point of fault. The sensing and control response time for the adjustment in the phase voltage to eliminate the arc at the fault point is approximately two cycles. In the intervening transient period the ground fault currents that flow in the system are determined by the Peterson Coil, the fault impedance, and the stray capacitance of the feeders served by the bus in the substation where the REFCL compensation system is deployed. In this transient time the watt-metric elements in the downline feeder protective devices can sense the direction and magnitude of the zero-sequence real power due to the fault and the interconnection of the Peterson Coil. Detection speed is crucial since the REFCL compensation system change the zero-sequence real power flow once the compensation system activates.

However, the operation of a REFCL compensation system does not disconnect the faulted circuit segment from the network. Traditionally, the fault location method used on these circuits includes disconnecting circuit segments in succession until the faulted feeder is found, then patrolling that feeder until the fault location is identified and repaired. Since REFCL compensation systems detect and operate within a few cycles, and the compensator current injection effectively masks the normal flow of fault current on resonant systems, conventional earth fault detection and location methods for resonant systems are ineffective.

SUMMARY

The following discussion discloses and describes a system and method for identifying an earth fault in a resonant grounded medium voltage network that employs a REFCL compensation system. The network includes a power source that serves a plurality of three-phase feeders, where each feeder includes at least one switching device, and where the method is performed in one or more of the switching devices. The method derives a zero-sequence real power from a complex phase voltage to ground on each phase and a complex current on each phase and aligns the zero-sequence real power in time with a magnitude of a zero-sequence voltage provided by the REFCL compensation system. The method determines when the zero-sequence real power exceeds a predetermined zero-sequence real power threshold and determines when the zero-sequence voltage exceeds a predetermined zero-sequence voltage threshold. The method delays the magnitude of the zero-sequence voltage for a predetermined period of time when the zero-sequence voltage exceeds the predetermined zero-sequence voltage threshold and determines that the fault is occurring when both the time aligned zero-sequence real power exceeds the zero-sequence real power threshold and the magnitude of the zero-sequence voltage exceeds the zero-sequence voltage threshold for the predetermined period of time at the same time.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a system and method for identifying an earth fault in a resonant grounded medium voltage network that employs a REFCL compensation system is merely exemplary in nature, and is in no way intended to limit the disclosure or its applications or uses.

REFCL compensation system logic combines two salient features of the system earthing methods. The network is passively resonant earthed through an arc suppression coil that is closely tuned to match the line-to-earth capacitance of the connected circuits. Damping resistors are not normally used in conjunction with the arc suppression coil, so the zero-sequence system damping is primarily determined by losses in the arc suppression coil and conductance to earth of the insulation system throughout the circuits. In passive resonant-earthed networks represented by symmetrical component network equivalent circuits, real power flows from the positive sequence source, through the fault point, and back toward the arc suppression coil in the substation via the zero-sequence equivalent network. This is the basis for the application of the watt-metric measurement method in earth fault location, where protection security is obtained using extended detection times of tens of cycles up to several seconds. Also, a few cycles after earth fault inception, the REFCL compensation system activates, making the system no longer passively resonant earthed. The earth fault detection system in the substation can be more sensitive than the remote devices on the lines. The REFCL compensation system activation may be interpreted by the remote devices as confirmation that an earth fault is present.

The following discussion describes a method that uses the combination of the above-described two pieces of information, which is observable by a remote switching device, for securely and accurately determining the unique signature of an earth fault, followed by REFCL compensation system activation, and the direction of the earth fault relative to the remote location of the line mounted protection device. This technique will allow a three-phase protection device located remote from the substation and REFCL compensation system to detect the presence of an earth fault on REFCL equipped systems. When the relative direction to the fault is known, the faulted segment can be disconnected (sectionalized) automatically, thereby reducing the effort to find the fault, make repairs, and restore the circuit segment to service. The method also eliminates the need to interrupt service to customers served by the same substation on unfaulted feeders, thus improving overall customer reliability metrics.

Figure 1:
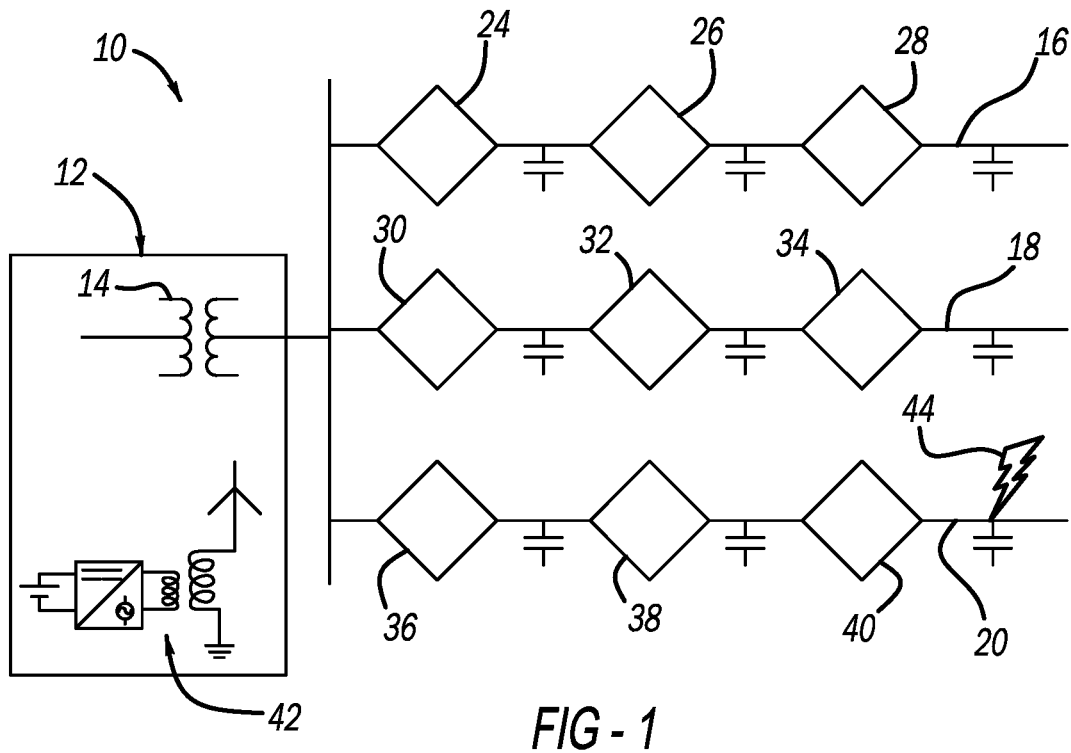
FIG. 1 is a schematic block diagram of a resonant grounded medium voltage network that includes a REFCL compensation system.

FIG. 1 is a schematic type block diagram of a resonant grounded medium voltage network 10 including a substation 12 having a substation transformer 14 that serves three, three-phase feeders 16, 18 and 20. In this non-limiting example, the feeder 16 includes three recloser type switching devices 24, 26 and 28, the feeder 18 includes three recloser type switching devices 30, 32 and 34, and the feeder 20 includes three recloser type switching devices 36, 38 and 40. The substation 12 also includes a REFCL compensation system 42 that injects current into the Peterson coil and therefore onto the feeders 16, 18 and 20 in response to a fault, such as fault 44 downstream of the switching device 40, in the manner described above.

Figure 2:
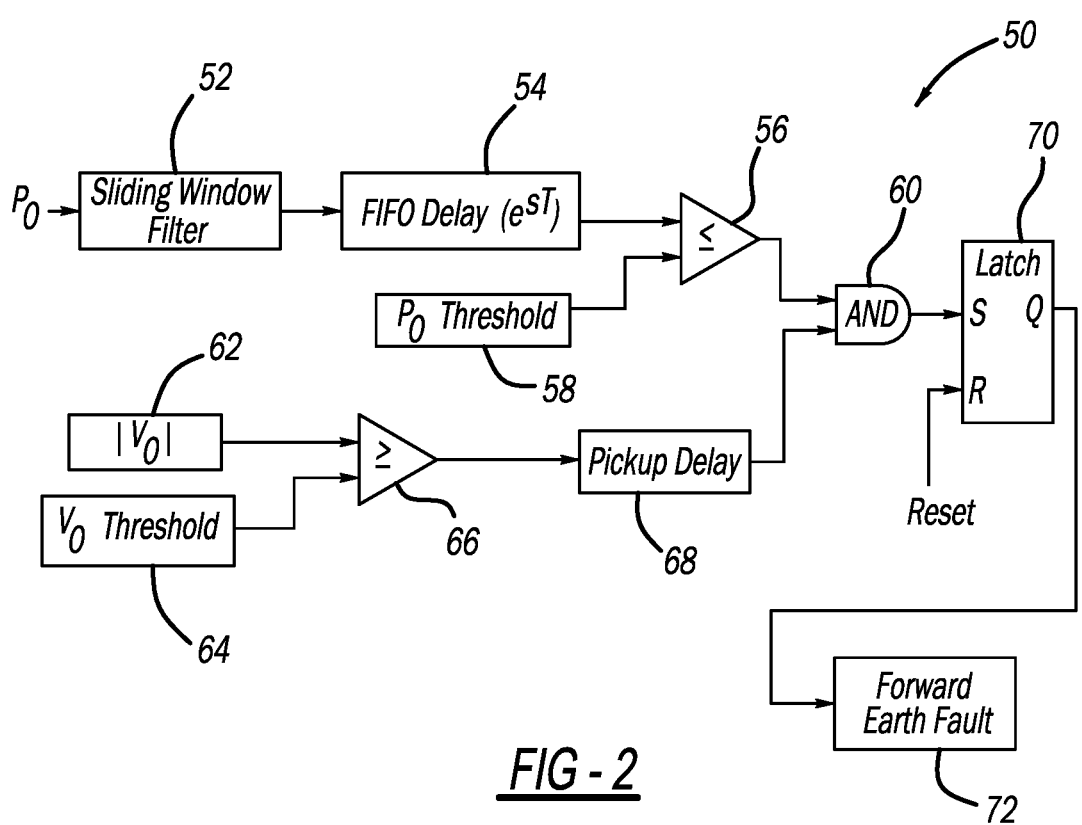
FIG. 2 is a schematic block diagram of a fault identification system that identifies an earth fault in a resonant grounded medium voltage network that employs a REFCL compensation system.

FIG. 2 is a schematic block diagram of a fault identification system 50 that detects, for example, the fault 44, and can be provided in the control logic of one, some or all of the switching devices 24-40. Each of the switching devices 24-40 measures the complex three-phase voltage to ground and the complex current on each phase. The voltages are added to obtain a complex zero-sequence voltage and the currents are added to obtain a complex zero-sequence current. A zero-sequence real power signal $P_0$ is then derived from the complex zero-sequence voltage and the complex zero-sequence current.

The zero-sequence real power signal $P_0$ is averaged using a sliding window filter 52 and then sent to a first-in-first-out (FIFO) buffer 54 that aligns the averaged zero-sequence real power signal $P_0$ when the fault 44 is occurring in time with the magnitude of the zero-sequence voltage $V_0$ provided by the REFCL compensation system 42 that cancels the fault voltage. The averaged zero-sequence real power signal $P_0$ is sent to a comparator 56 along with a predetermined threshold from box 58, where if the averaged zero-sequence real power signal $P_0$ exceeds the threshold, the fault 44 will likely be present in the indicated direction, and the logical output of the comparator 56 is sent to an AND gate 60.

The magnitude of the zero-sequence voltage $V_0$ provided at box 62 and a predetermined zero-sequence voltage threshold provided at box 64 are sent to a comparator 66 that outputs the magnitude of the zero-sequence voltage $V_0$ to a pick-up delay box 68 to determine whether the zero-sequence voltage $V_0$ exceeds the threshold for a predetermined period of time. In other words, if the input to the box 68 is true for the predetermined period of time, then the output of the box 68 will go true. The logical output of the pick-up delay box 68 is then sent to the AND gate 60. A high at the output of the AND gate 60 identifies the fault 44 in the forward direction when both the averaged and time aligned zero-sequence real power signal $P_0$ exceeds its threshold and the magnitude of the zero-sequence voltage $V_0$ exceeds its threshold for the predetermined period of time at the same time. When the earth fault 44 is identified as occurring it is latched in memory by a latch 70, which is required because the measured zero-sequence real power signal $P_0$ after the REFCL compensation system 42 has been activated is no longer a meaningful indicator of relative fault direction. The fault 44 is reported at box 72 as desired, such as a command to open the particular switching device 24-40. In this example, the switching devices 36, 38 and 40 would report the fault 44, which is an indication that the fault 44 is downstream of the switching device 40. The device 40 can then be opened, and the rest of the network 10 returned to normal operation.

For positive identification of earth faults in the opposite direction, for example due to reverse polarity connection of the remote device, a complementary set of zero-sequence real power thresholds may be applied. Further, to achieve correct signaling with dual directional detectors, where the substation transformer 14 and the REFCL compensation system 42 may be located in either direction relative to the subject remote device, it is necessary to incorporate logic between the two detectors that blocks the second detector upon activation of the first detector.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for identifying an earth fault in a resonant grounded medium voltage network, the network including a power source that serves a plurality of three-phase feeders and a rapid earth fault current limiting (REFCL) compensation system, each feeder including at least one switching device, wherein the method is performed in one or more of the switching devices, the method comprising:
    deriving a zero-sequence real power from a complex phase voltage to ground on each phase and a complex current on each phase;
    aligning the zero-sequence real power in time with a magnitude of a zero-sequence voltage provided by the REFCL compensation system;
    determining when the zero-sequence real power exceeds a predetermined zero-sequence real power threshold;
    determining when the zero-sequence voltage exceeds a predetermined zero-sequence voltage threshold;
    delaying the magnitude of the zero-sequence voltage for a predetermined period of time when the zero-sequence voltage exceeds the predetermined zero-sequence voltage threshold; and
    determining that the fault is occurring when both the time aligned zero-sequence real power exceeds the zero-sequence real power threshold and the magnitude of the zero-sequence voltage exceeds the zero-sequence voltage threshold for the predetermined period of time at the same time.

2. The method according to claim 1 wherein deriving a zero-sequence real power includes measuring the phase voltage to ground on each phase, adding the measured phase voltages to ground, measuring the current on each phase, adding the measured currents and deriving the zero-sequence real power using the added phase voltages to ground and the added measured currents.

3. The method according to claim 1 further comprising averaging the zero-sequence real power before it is aligned with the magnitude of the zero-sequence voltage.

4. The method according to claim 1 wherein aligning the zero-sequence real power when the fault is occurring in time with a magnitude of a zero-sequence voltage includes using a first-in-first-out (FIFO) buffer.

5. The method according to claim 1 further comprising latching the determination that the fault is occurring in memory so as to determine the direction of the fault.

6. The method according to claim 1 wherein the one or more switching devices opens in response to identifying the fault.

7. The method according to claim 1 wherein the REFCL compensation system is provided in a substation in the network.

8. The method according to claim 1 wherein each of the feeders includes a plurality of the switching devices where each switching device performs the method.

9. A method for identifying an earth fault in an electrical network, the network including a power source that serves a plurality of feeders and a rapid earth fault current limiting (REFCL) compensation system, each feeder including at least one switching device, wherein the method is performed in one or more of the switching devices, the method comprising:
    deriving a zero-sequence real power from a plurality of phase to ground voltage measurements and a plurality of phase current measurements;
    aligning the zero-sequence real power in time with a magnitude of a zero-sequence voltage provided by the REFCL compensation system;
    determining when the zero-sequence real power exceeds a predetermined zero-sequence real power threshold;
    determining when the zero-sequence voltage exceeds a predetermined zero-sequence voltage threshold;
    delaying the magnitude of the zero-sequence voltage for a predetermined period of time when the zero-sequence voltage exceeds the predetermined zero-sequence voltage threshold; and
    determining that the fault is occurring when both the time aligned zero-sequence real power exceeds the zero-sequence real power threshold and the magnitude of the zero-sequence voltage exceeds the zero-sequence voltage threshold for the predetermined period of time at the same time.

10. The method according to claim 9 further comprising averaging the zero-sequence real power before it is aligned with the magnitude of the zero-sequence voltage.

11. The method according to claim 9 further comprising latching the determination that the fault is occurring in memory so as to determine the direction of the fault.

12. The method according to claim 9 wherein the plurality of feeders are a plurality of three-phase feeders.

13. A system for identifying an earth fault in a resonant grounded medium voltage network, the network including a power source that serves a plurality of three-phase feeders and a rapid earth fault current limiting (REFCL) compensation device, each feeder including at least one switching device, wherein the method is performed in one or more of the switching devices, the system comprising:
    means for deriving a zero-sequence real power from a complex phase voltage to ground on each phase and a complex current on each phase;
    means for aligning the zero-sequence real power in time with a magnitude of a zero-sequence voltage provided by the REFCL compensation system;
    means for determining when the zero-sequence real power exceeds a predetermined zero-sequence real power threshold;
    means for determining when the zero-sequence voltage exceeds a predetermined zero-sequence voltage threshold;
    means for delaying the magnitude of the zero-sequence voltage for a predetermined period of time when the zero-sequence voltage exceeds the predetermined zero-sequence voltage threshold; and
    means for determining that the fault is occurring when both the time aligned zero-sequence real power exceeds the zero-sequence real power threshold and the magnitude of the zero-sequence voltage exceeds the zero-sequence voltage threshold for the predetermined period of time at the same time.

14. The system according to claim 13 wherein the means for deriving a real zero-sequence real power measures the phase voltage to ground on each phase, adds the measured phase voltages to ground, measures the current on each phase, adds the measured currents and derives the zero-sequence real power using the added phase voltages to ground and the added measured currents.

15. The system according to claim 13 further comprising means for averaging the zero-sequence real power before it is aligned with the magnitude of the zero-sequence voltage.

16. The system according to claim 13 wherein the means for aligning the zero-sequence real power when the fault is occurring in time with a magnitude of a zero-sequence voltage uses a first-in-first-out (FIFO) buffer.

17. The system according to claim 13 further comprising means for latching the determination that the fault is occurring in memory so as to determine the direction of the fault.

18. The system according to claim 13 wherein the one or more switching devices opens in response to identifying the fault.

19. The system according to claim 13 wherein the REFCL compensation system is provided in a substation in the network.

* * * * *